(12) United States Patent
Kuegler et al.

(10) Patent No.: US 6,928,597 B2
(45) Date of Patent: Aug. 9, 2005

(54) METHOD AND APPARATUS FOR TESTING DIGITAL CIRCUITRY

(75) Inventors: Marcus Kuegler, Zurich (CH); Ali Badiei, Zurich (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 212 days.

(21) Appl. No.: 09/825,279

(22) Filed: Apr. 3, 2001

(65) Prior Publication Data

US 2002/0053056 A1 May 2, 2002

(30) Foreign Application Priority Data

Apr. 5, 2000 (EP) .............................................. 00201242

(51) Int. Cl.[7] .......................... G01R 31/28; H04B 1/38
(52) U.S. Cl. ........................ 714/724; 714/733; 375/221; 375/224; 370/249
(58) Field of Search ................................ 714/724, 733, 714/734, 736; 326/16, 30, 82; 359/174, 179; 370/249; 375/222, 224; 385/16

(56) References Cited

U.S. PATENT DOCUMENTS

| | | | |
|---|---|---|---|
| 5,787,114 A | | 7/1998 | Ramamurthy et al. ...... 375/221 |
| 6,348,811 B1 | * | 2/2002 | Haycock et al. .............. 326/16 |
| 6,493,124 B1 | * | 12/2002 | Haberkorn .................. 359/174 |

* cited by examiner

Primary Examiner—Emmanuel L. Moise
(74) Attorney, Agent, or Firm—Michael J. Ure

(57) ABSTRACT

Digital circuitry is tested through effecting a paired data loop-back from a first buffered output to a first buffered input whilst within the circuitry executing at least part of the test through using a Built-In-Self-Test methodology. In particular, the loop-back is effected from the first buffered data output to a buffered control input, from a buffered control output to the first buffered data input, or both. Advantageously, the buffering is associated to executing a conversion between a digital full swing internal signal and an analog low swing external signal with respect to core circuitry of the digital circuitry.

5 Claims, 5 Drawing Sheets

METHOD AND APPARATUS FOR TESTING DIGITAL CIRCUITRY

BACKGROUND OF THE INVENTION

The invention relates to a method for testing digital circuitry. In general, digital full swing high speed data transmission between two integrated circuit chips necessitates the use of a wide-frequency spectrum. Therefore, actual data transmission is very frequency sensitive. To reduce frequency sensitivity, it is better to send an analog low swing bit stream instead of digital data. Now, for sending analog bit streams, an analog low swing interface (LSI) is necessary; note that this abbreviation has a different meaning from everyday usage in electronic technology. To ensure correct functionality of this interface it is these low swing interface signals should be rendered digitally testable. However, a standard manufacturing test machine cannot handle the analog input and analog output signals. Therefore, a specific test interface facility should be provided, for executing the actual digital manufacturing tests.

SUMMARY TO THE INVENTION

In consequence, amongst other things, it is an object of the present invention to provide a test facility that in the context of a loop-back configuration will be able to straightforwardly communicate test and/or result patterns to/from the intended destinations and/or sources while minimizing various items thereof with respect to cost, complexity, bandwidth, frequency sensitivity and other parameters that would burden a test manager.

Now therefore, the invention provides digital circuitry testing as defined by the independent Claims.

Further advantageous aspects of the invention are recited in dependent Claims.

BRIEF DESCRIPTION OF THE DRAWING

These and further aspects and advantages of the invention will be discussed more in detail hereinafter with reference to the disclosure of preferred embodiments, and in particular with reference to the appended Figures that show.

DETAILED DESCRIPTION OF PREFERRED EMBODIMENTS

Figure 1:
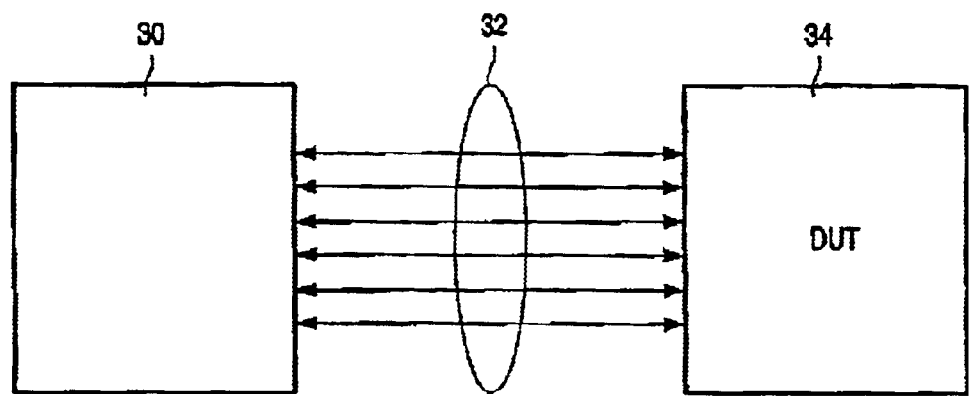
FIG. 1, an archetypical test configuration.

FIG. 1 diagrammatically illustrates an archetypical test configuration. Herein, TESTER block 30 generates and provides test patterns through interconnection facility 32 to the Device Under Test 34. After execution of the test, the results of the test through interconnection facility 32 return to the tester block for evaluation, which may result in reject, repair, or pass in whole or in part. Tester block 30 may be either a separate device or may be wholly or partially integrated with the device under test. For brevity, external usage of the test results has not been shown in the Figure.

Figure 2:
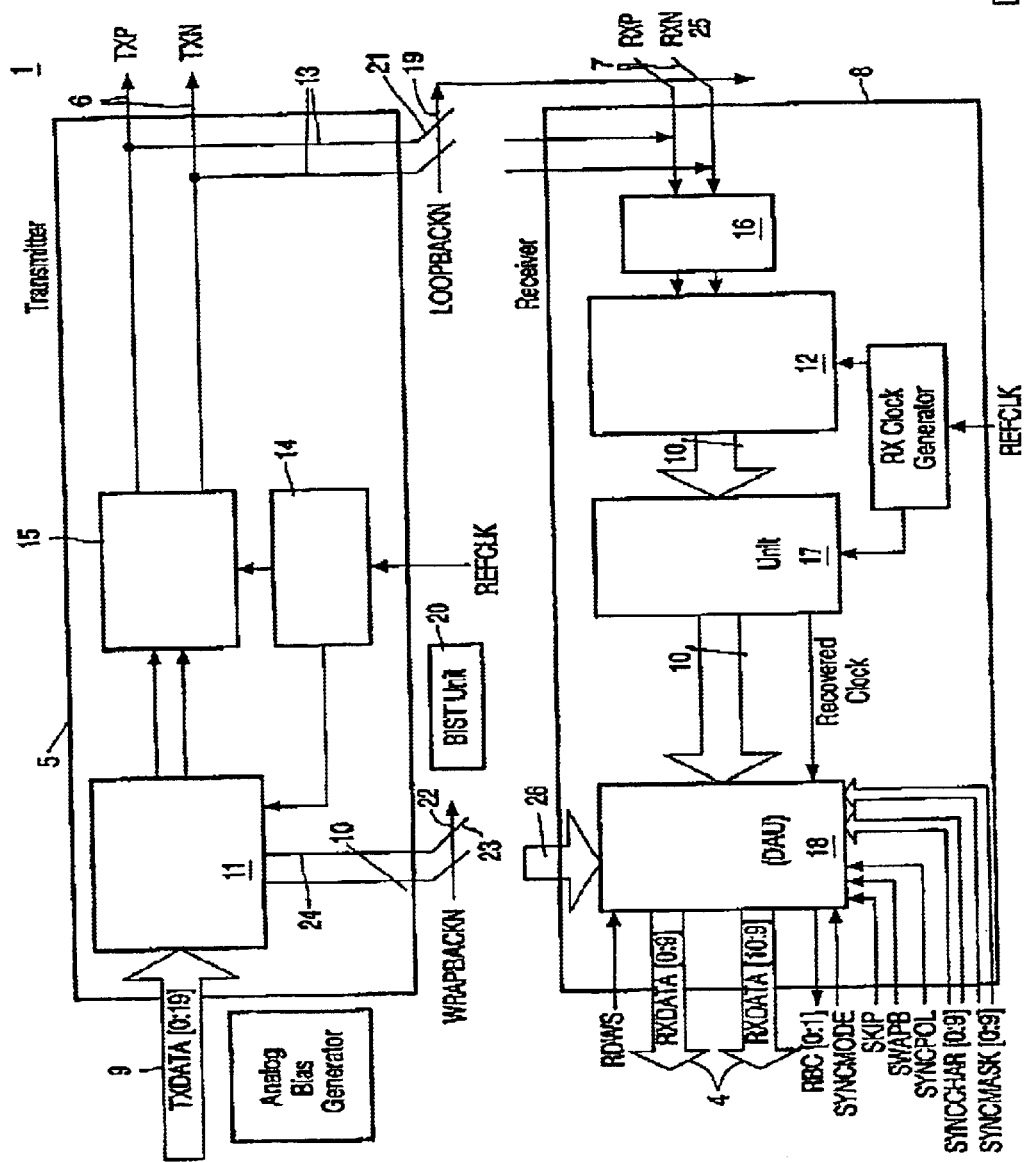
FIG. 2, a prior art loop-back test system.

FIG. 2 diagrammatically illustrates a prior art loop-back test system as disclosed more fully in U.S. Pat. No. 5,787,114, and in particular, FIG. 3 thereof. Here, under non-test circumstances, parallel digital output patterns 9 are presented to a transmitter 5, serialized by serializer 11, buffered by output buffer 15, clocked by TX clock generators 14, and outputted 6 on a P/N wire pair. Also, serial digital input patterns received on a P/N wire pair 7 are buffered by input buffer 16, deserialized by deserializer 12, clock-extracted by Data and Clock Recovery Unit 17 and/or reference-clocked (REFCLK), aligned by Data Alignment Unit 18, and presented as parallel input patterns 4. Under test conditions, a switch 19 is closed for effecting loop-back, whereas switch 25 is opened for effecting insulation from the outer world. A Built-In-Self-Test unit 20 may, through generating a wrapback control 22 and in cooperation with a switch 23 effect a wrapback 10 from the data alignment unit 18 to the serializer 11, thereby effectively limiting the test procedures to only the I/O interface facilities. Furthermore, an interconnection 26 with Data Alignment Unit 18 has been shown. For additional detail, reference is had to the full prior art specification.

Figure 3:
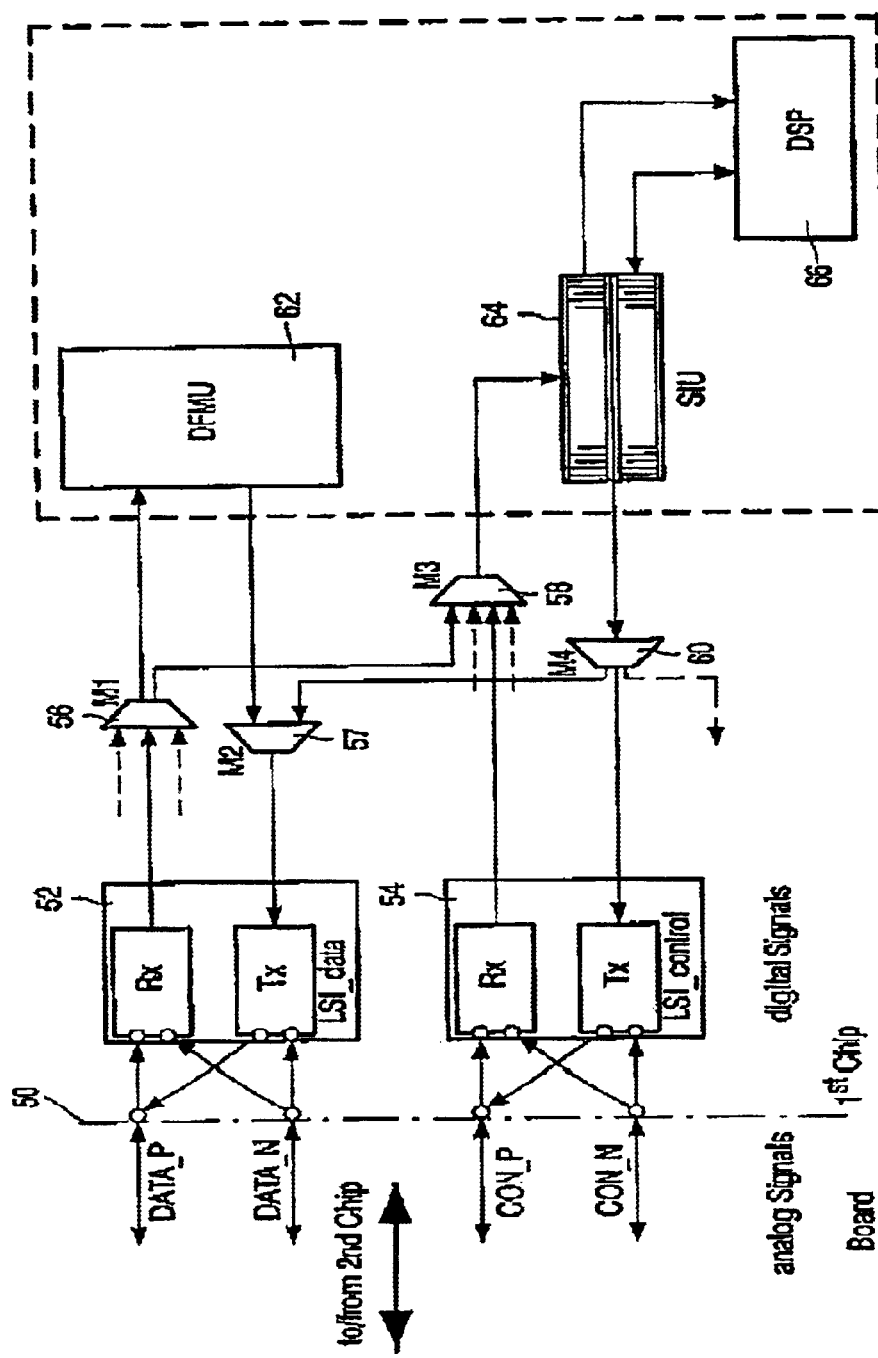
FIG. 3, the LSI device in normal mode.

FIG. 3 shows the Low Swing Interface circuitry to be tested still in normal mode, with a conceptual interface 50 that communicates analog signals between the first comprehensive chip actually shown and a further chip with an appropriate interface not shown. The interface to the outer world numbers a Transmit/Receive (RxTx) pair, one for data signals 52 and one for control signals 54. For effecting bidirectional transmission, each time an input lead has been joined to an output lead. No further chip has been shown for brevity.

In contradistinction to the above, the core functionality at right in the Circuit comprises by way of example a Digital Function Master Unit 62 in which the data handling functionality proper is effected, a Serial Input/Output unit 64, and a Digital Signal Processor 66 that is serially and bidirectionally interconnected to SIU 64. Clocking of the latter is effected through gate M3 58 that gets control signals as well as data signals. As shown for brevity, SIU only operates as a data source with respect to the outer world. Furthermore, gate M1 56 presents data to DFMU 62, and synchronizing signals to gate M3 58. Gate M2 57 presents data to the outer world, as received from DFMU 62 and SIU 64. In similar manner, control signals are communicated between LSI 54 and gates M3 58 and M4 60.

In this setup, the analog transmitter circuits Tx will convert the digital full swing signal into an analog low swing signal. In its turn, the analog receiver will transform the low swing analog signal back into a full swing digital signal. In fact, a digital production test machine is not capable to evaluate the analog signals, so that effectively, the instant test interface solves a pressing problem.

In the setup, communication between the two chips necessitates at least two of the interface arrangements. Of these, the first one 54 will send the control signals on two paired full-differential lines. The second interface 52 effects data transmission on two further likewise paired full-differential lines. To save power and to suppress unwanted self-coupling and instability, the Rx of the transmitting LSI is in power-off mode, for data signals just as for control signals. Otherwise, the Tx is switched off while receiving. Therefore, one control signal, not shown for brevity, is needed for every Low Swing Interface circuit. Now, with this prior art test interface there are three different operating modes:

Transmitting, with Tx on and Rx off.

Receiving, with Tx off and Rx on.

Testing, with both Tx and Rx on.

The providing of these three modes necessitates extra design effort for the power control circuit of the LSI under test, and moreover, for each LSI a second control wire is necessary for effecting these three modes, inasmuch as a single wire is insufficient.

Figure 4:
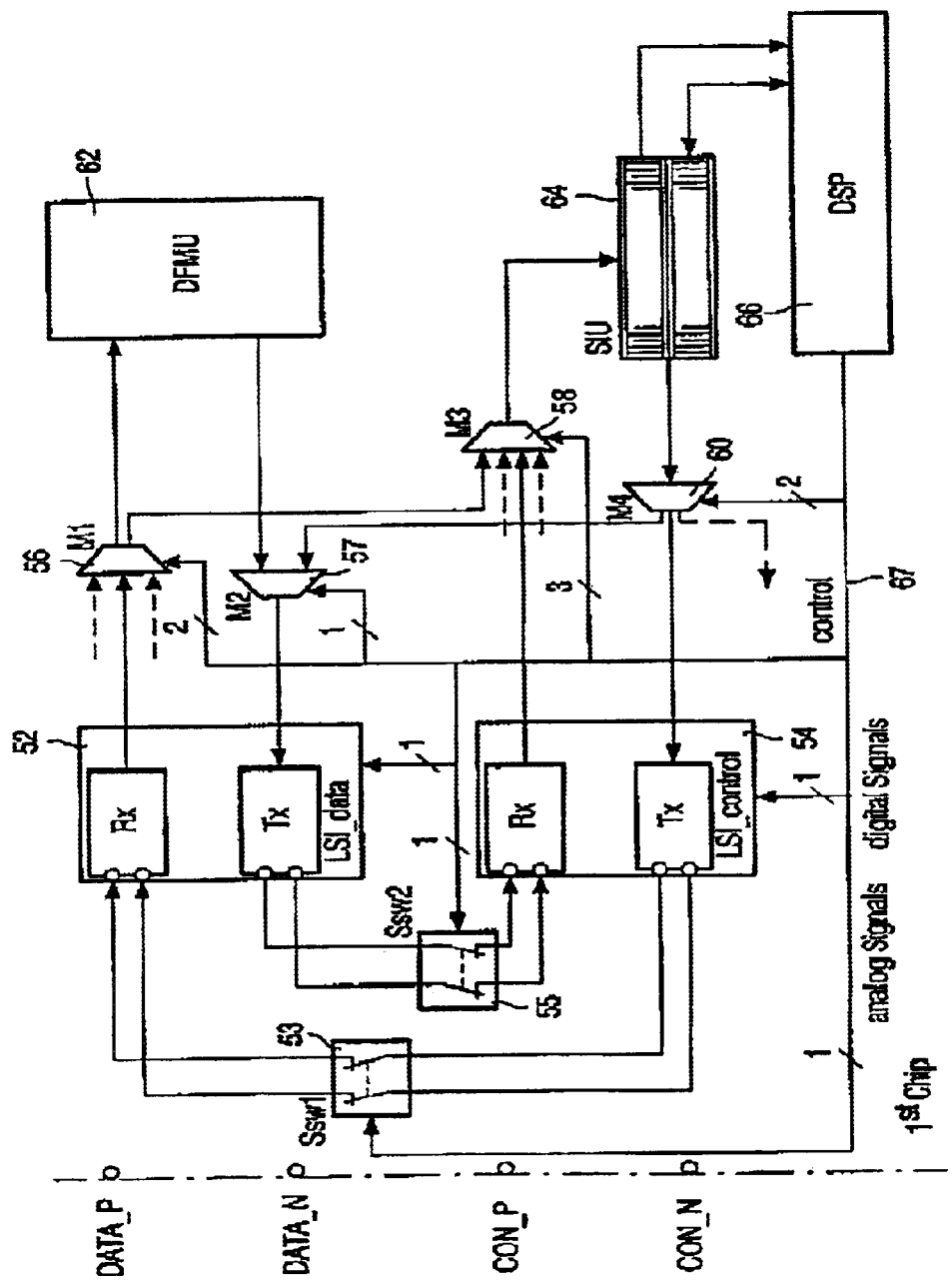
FIG. 4, the test interface of FIG. 3's circuitry in actual test mode.

In this respect, FIG. 4 illustrates the test interface of the present invention operating in actual test mode. Generally, elements 52, 54, 56, 57, 58, 60, 62, 64, 66 correspond to those of FIG. 3. The above two disadvantages are now avoided by this low power for a low swing interface. Such has been effected by the cross-coupling of both interfaces. In consequence, there are now only two conditions for every LSI circuit, as follows:

Transmitting, with Tx on and Rx off.
Receiving, with Tx off and Rx on.

Having only these two modes renders it much easier to save power. As shown, Switches 53 and 55 provide loop-back between data transmitter and control receiver, and between control transmitter and data receiver, respectively. Each of these two is controlled by a single bit as has been indicated on control line 67. Such is also the case for the control LSI and data LSI themselves. The control is provided by block 66 in the lower right corner of the Figure. Furthermore, the appropriate number of control bits has been indicated with respect to the various gates 56, 57, 58, 60. Gate M2 57 needs only one control bit to select between standard data out and test data out. Gate M1 56 needs two control bits to select between standard data in and test data in, on the one hand, and between various different sources, on the other hand, four possibilities in total in this embodiment as indicated. Likewise, Gate M4 60 needs two control bits to select between standard data out and test data out, on the one hand, and between various different destinations, on the other hand, three possibilities in total in this embodiment as indicated. Likewise, Gate M3 58 needs three control bits to select between standard data in and control in, on the one hand, and between various different sources, on the other hand, four possibilities in total in this embodiment as indicated.

It should be noted that the above-mentioned embodiments illustrate rather than limit the invention, and that those skilled in the art will be able to design many alternative embodiments without departing from the scope of the appended Claims.

Figure 5:
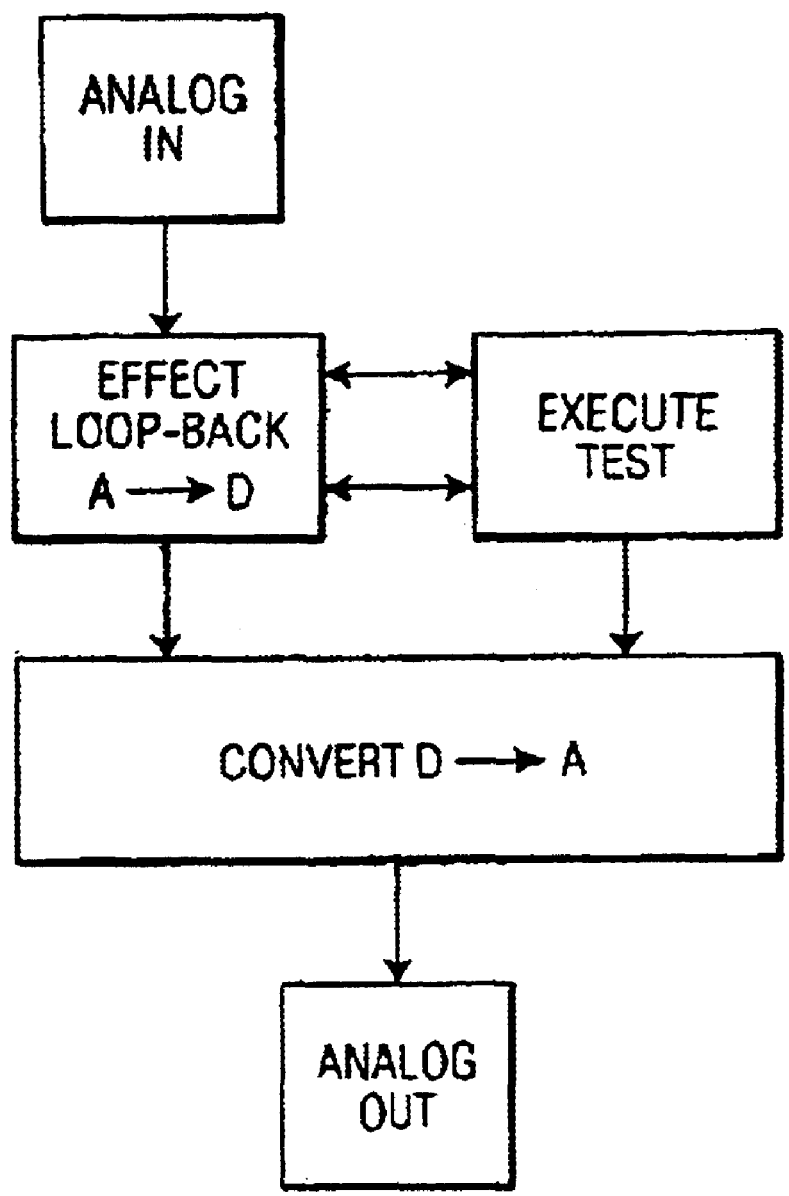
FIG. 5, a conceptual diagram of the present test method.

FIG. 5 depicts several steps for practicing a method for testing digital circuitry. The method includes the steps of receiving an analog input signal, effect a loop back from a first buffered output, executing a test, receiving a buffered input, converting between an analog low swing external signal to a digital full swing internal signal, and converting a digital full swing signal to an analog low swing external signal, and outputting the analog signal.

What is claimed is:

1. A method for testing digital circuitry comprising:

effecting a paired loop-back from a first buffered output to a first buffered input;

executing at least part of the test through using a Built-In-Self-Test methodology within the circuitry, wherein the effecting step further comprises effecting said loop-back from the first buffered data output to a buffered control input, and wherein the method further comprises executing a conversion step between a digital full swing internal signal and an analog low swing external signal and a conversion step between an analog low swing signal and a digital full swing signal, with respect to core circuitry of said digital circuitry.

2. A method as claimed in claim 1, characterized by effecting said loop-back from a buffered control output to the first buffered data input.

3. A method as claimed in claim 1, wherein both said loop-back as well as said buffering are controlled through a one-bit control signal.

4. A method as claimed in claim 3, wherein signal routing between said buffering on the one hand, and test circuitry as well as core circuitry of said digital circuitry, on the other hand, are controlled through a plural bit control signal.

5. A method for testing digital circuitry comprising:

effecting a paired data loop-back from a first buffered output to a first buffered input;

executing within the circuitry at least part of the test through using a Built-In-Self-Test methodology, wherein the effecting step further comprises effecting said loop-back from a buffered control output to the first buffered data input, and wherein the method further comprises in connection with said buffering, executing a conversion step between a digital full swing internal signal and an analog low swing external signal and a conversion step between an analog low swing signal and a digital full swing signal, with respect to core circuitry of said digital circuitry.

* * * * *